(12) United States Patent
Wu et al.

(10) Patent No.: US 7,072,780 B2
(45) Date of Patent: Jul. 4, 2006

(54) IMPEDANCE STANDARD SUBSTRATE AND CORRECTION METHOD FOR VECTOR NETWORK ANALYZER

(75) Inventors: Sung-Mao Wu, Kaohsiung (TW); Chi-Tsung Chiu, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 320 days.

(21) Appl. No.: 10/745,576

(22) Filed: Dec. 29, 2003

(65) Prior Publication Data

US 2004/0138844 A1 Jul. 15, 2004

(30) Foreign Application Priority Data

Dec. 25, 2002 (TW) .................................... 91137391 A

(51) Int. Cl.
*G06F 19/00* (2006.01)

(52) U.S. Cl. ................. 702/62; 702/104; 702/107; 702/117

(58) Field of Classification Search ............ 702/57, 702/58, 65, 81, 82, 91, 104, 107, 117, 118, 702/167, 168; 324/601, 638, 754; 438/11, 438/18

See application file for complete search history.

(56) References Cited

U.S. PATENT DOCUMENTS

| 4,858,160 | A | | 8/1989 | Strid et al. |
| 5,047,725 | A | | 9/1991 | Strid et al. |
| 6,146,908 | A | * | 11/2000 | Falque et al. ................. 438/11 |
| 6,348,804 | B1 | | 2/2002 | Evers |
| 6,480,013 | B1 | * | 11/2002 | Nayler et al. ............... 324/754 |

* cited by examiner

*Primary Examiner*—Bryan Bui
(74) *Attorney, Agent, or Firm*—Bacon & Thomas PLLC

(57) ABSTRACT

An Impedance standard substrate for adjusting a vector network analyzer mainly comprises a fixer and a flexible tape, wherein the vector network analyzer has a plurality of pairs of probes disposed at an underneath of the impedance standard substrate and an upside of the impedance standard substrate. There are thru-circuits formed at the flexible tape, wherein the flexible tape has electrically connecting contacts and the contacts are electrically connected to each other. The flexible tape is bent and fixed to a fixer such that the contacts are faced to the corresponding probes respectively. Furthermore, the impedance standard substrate also includes a plurality of pairs of open-circuits, short-circuits and load-circuits formed at the flexible tape.

10 Claims, 5 Drawing Sheets

IMPEDANCE STANDARD SUBSTRATE AND CORRECTION METHOD FOR VECTOR NETWORK ANALYZER

BACKGROUND OF THE INVENTION

1. Field of Invention

This invention relates to an impedance standard substrate and a correction method for adjusting a vector network analyzer. More particularly, the present invention is related to an impedance standard substrate with double-sided contacts and a correction method for adjusting the vector network analyzer.

2. Related Art

Generally speaking, conventional vector network analyzers are patented as shown in U.S. Pat. No. 6,348,804 to Evers et. al entitled "Vector Network Analyzer", U.S. Pat. No. 5,047,725 to Strid et.al entitled "Verification and a correction method for an error model for a measurement network" and U.S. Pat. No 4,858,160 to Strid et. al entitled "System for setting reference reactance for vector corrected measurement". As mentioned above, the conventional vector network analyzers utilize one or two radio frequency sources (RF source) to provide a signal in high frequency, and two measuring ports for transmitting the signal to a device under test (DUT). Then, a Test Set for testing said signal utilizes Directional Couplers or Directional Bridge to separate the signal transmitting to DUT (incident signal) from the signal reflecting from the signal transmitting to DUT (reflective signal). The frequency of the incident signal and the frequency of the reflective signal shall be lowered by LNB made of LO source and Mixer, and then the processes of filtering the digital signals, amplifying the digital signals, converting the digital signals and displaying the measurements data are performed.

The incident coefficient and the reflective coefficient shall be measured with high precision in measurement of high frequency circuits. And the measurement system adjusts the error of the measurement by the error factor of the incident coefficient and the reflective coefficient.

As mentioned above, the error factor is determined and defined by measuring the known and given standard impedance and comparing said given standard impedance with the measurement data that we get. As we know, there are different standard impedances, however, the standard impedance comprising open-circuits, short-circuits, load-circuits and thru-circuits is usually taken to be a standard reference. As shown above, said measuring port of the vector network analyzer comprises a probe utilized to be in contact with the contacts of the open-circuits, the short-circuits, the load-circuits and the thru-circuits separately so as to define the error factor of the vector network analyzer and adjust the vector network analyzer through the error factor and the given standard impedance.

As shown above, the standard impedance is disposed at one side of a substrate as named an impedance standard substrate. Namely, the conventional impedance standard substrate has one-sided contacts. However, the substrate (one of DUT for measurement) utilized in ball grid array packages (BGAs) has double-sided contacts so that after said one of the probes is adjusted at the upper side of the substrate, said probe shall be rotated at 180 degrees and disposed at the lower side of the substrate to measure the substrate. Specifically, the probes shall be contacted to two contacts of the thru-circuits located at the upper side and the lower side of the substrate when the thru-circuits are under measurement. Accordingly, the rotation of the probes will not be avoided. In addition, the rotation process shall be performed through complex mechanism and affects the precision of the measurement.

Therefore, providing another impedance standard substrate and a correction method for adjusting the vector network analyzer to solve the mentioned-above disadvantages is the most important task in this invention.

SUMMARY OF THE INVENTION

In view of the above-mentioned problems, an objective of this invention is to provide an impedance standard substrate with a double-sided contacts to adjust the vector network analyzer at the upper side and the lower side of the substrate simultaneously.

To achieve the above-mentioned objective, the impedance standard substrate with double-sided contacts is provided, wherein the impedance standard substrate mainly comprises a flexible tape and a fixer. Therein, the flexible tape has a thru-circuit with electrically connecting contacts. The flexible tape is bent and fixed to a fixer so as to have the contacts located at the upper side and the lower side and faced corresponding probes. In addition, the impedance standard substrate further comprises a plurality of pairs of short-circuits, open-circuits and load-circuits disposed at the flexile tape.

Furthermore, this invention also provide a correction method for adjusting said vector network analyzer as mentioned above.

To achieve the above-mentioned objective, the correction method for adjusting said vector network analyzer comprises the steps of providing a flexible tape having a thru-circuit with electrically connecting contacts, bending the flexible tape and fixing the flexible tape to a fixer so as to have said electrically connecting contacts located at the upper side and the lower side and faced the probes, contacting the probes with the contacts so as to output the measurement signals. Moreover, the correction method further comprises steps of providing a plurality of pairs of open-circuits, short-circuits and load-circuits disposed at the flexible tape, contacting the probes with said short-circuits, open-circuits and load-circuits so as to output the measurement signals.

In summary, the vector network analyzer can utilize the impedance standard substrate to get double-sided adjusted data so as to directly measure the DUT with double-sided contacts and get more precisely adjusted data without rotating the probe by a complex mechanism.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The impedance standard substrate and the correction method for the vector network analyzer according to the preferred embodiment of this invention will be described herein below with reference to the accompanying drawings, wherein the same reference numbers refer to the same elements.

Figure 1:
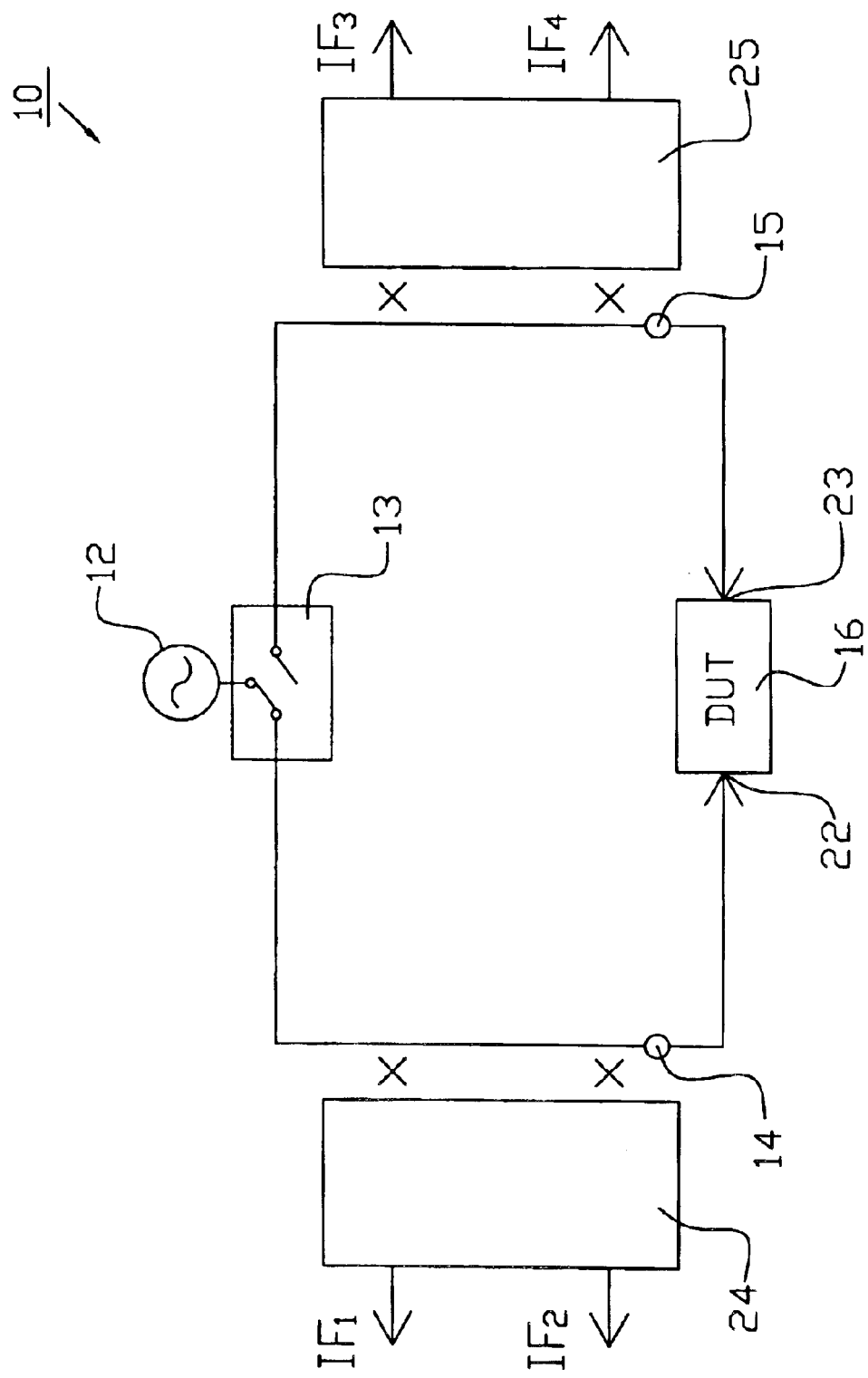
FIG. 1 is a block diagram of the vector network analyzer.

As shown in FIG. 1, it illustrates the vector network analyzer (VNA) 10. The vector network analyzer 10 comprises a radio-frequency source (RF Source) 12 for providing high frequency signals, which are alternately connected to two individual measuring ports 14 and 15 through a change-over switch 13. The two measuring ports 14 and 15 comprise the probes 22 and 23, respectively, which connect to a DUT (device under test) 16 so as to transmit the high frequency signals to DUT. The Test Set 24 and 25 of the vector network analyzer 10 separate the high frequency signals transmitting to DUT 16 from the signals reflecting from said high frequency signals transmitting to DUT and processing the signals to measure the DUT 16.

Figure 2A:
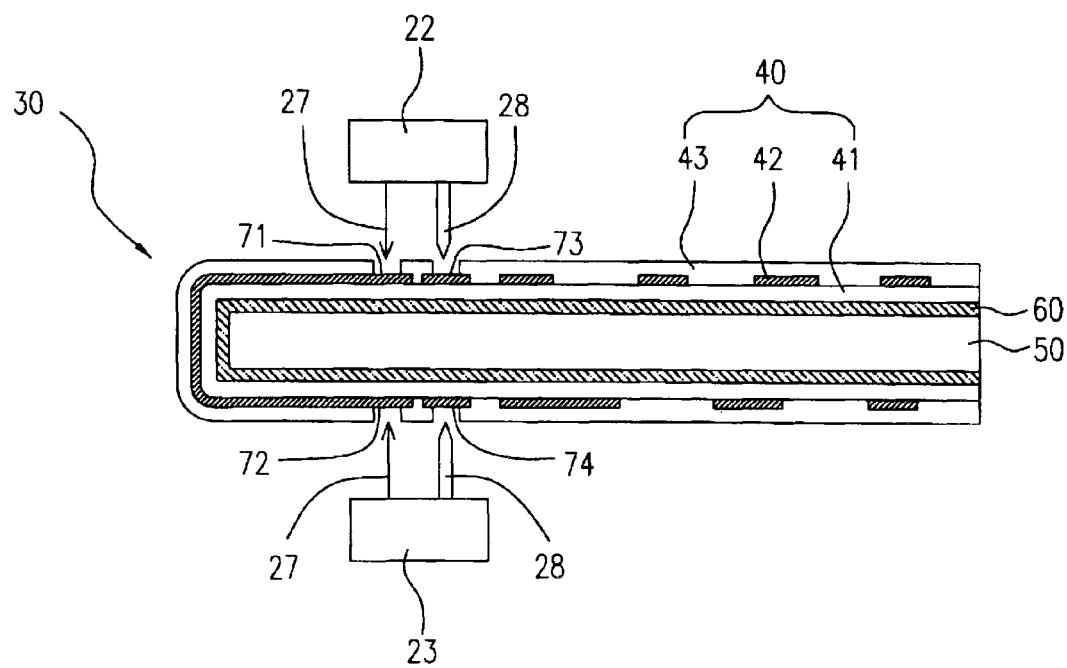
FIG. 2A is a cross-sectional view of an impedance standard substrate with double-sided contacts according to the first embodiment.
Figure 2B:
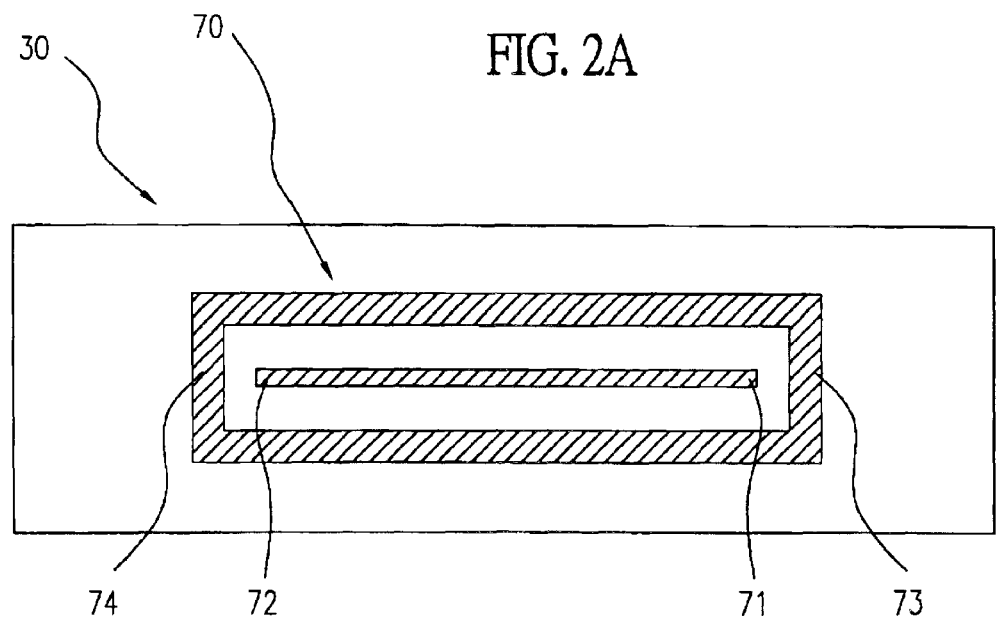
FIG. 2B is a simplified schematic diagram of said thru-circuits of FIG. 2A.

As shown in FIG. 2A, there is provided an impedance standard substrate 30 in accordance with the first preferred embodiment of this invention. In this embodiment, the impedance standard substrate 30 comprises a flexible tape 40 in a bent-type and a fixer 50. The flexible tape 40 have an insulation layer 41, a circuit layer 42, and a solder mask 43. Therein, the circuit layer 42 is formed on the insulation layer 41 and the solder mask 43 is disposed on the circuit layer 42. The material of the insulation layer can be selected from one of polyimide and epoxy, and the circuit layer 42 is made through the process of patterning the copper foil. Referring to FIG. 2B, it illustrates the arrangement of the circuits of the circuit layer of the flexible tape 40 before it is bent. Moreover, the design of the thru-circuits is set up and provided in accordance with the rule of having probes connected with each other and grounded mutually. The circuit layer 42 of the flexible tape 40 comprises thru-circuits 70 with a standard impedance wherein the signal contacts 71 and 72 are electrically connected with each other and the grounding contacts 73 and 74 are the two contacts located at the ground ring. Referring to FIG. 2A again, the flexible tape 40 is bent in the shape of "⊏" or other types and fixed to the fixer 50 through an adhesive 60 so as to have the two signal contacts 71 and 72 of the thru-circuits 70 located at the upper side and the lower side of the impedance standard substrate 30 and faced the probes 22 and 23. Besides, the fixer 50 may be an insulation plate or an insulation body so as to have the flexible tape in a bent-type fixed thereon. Moreover, in the operation for adjusting the vector network analyzer 10, the probes 22 and 23 of the vector network analyzer 10 are connected to the thru-circuits 70 to process the adjustment. Therein, the probes 22 and 23 comprise two pairs of signal connectors and grounding connectors for connecting the signal contacts 71 and 72, and the grounding contacts 73 and 74.

Figure 2C:
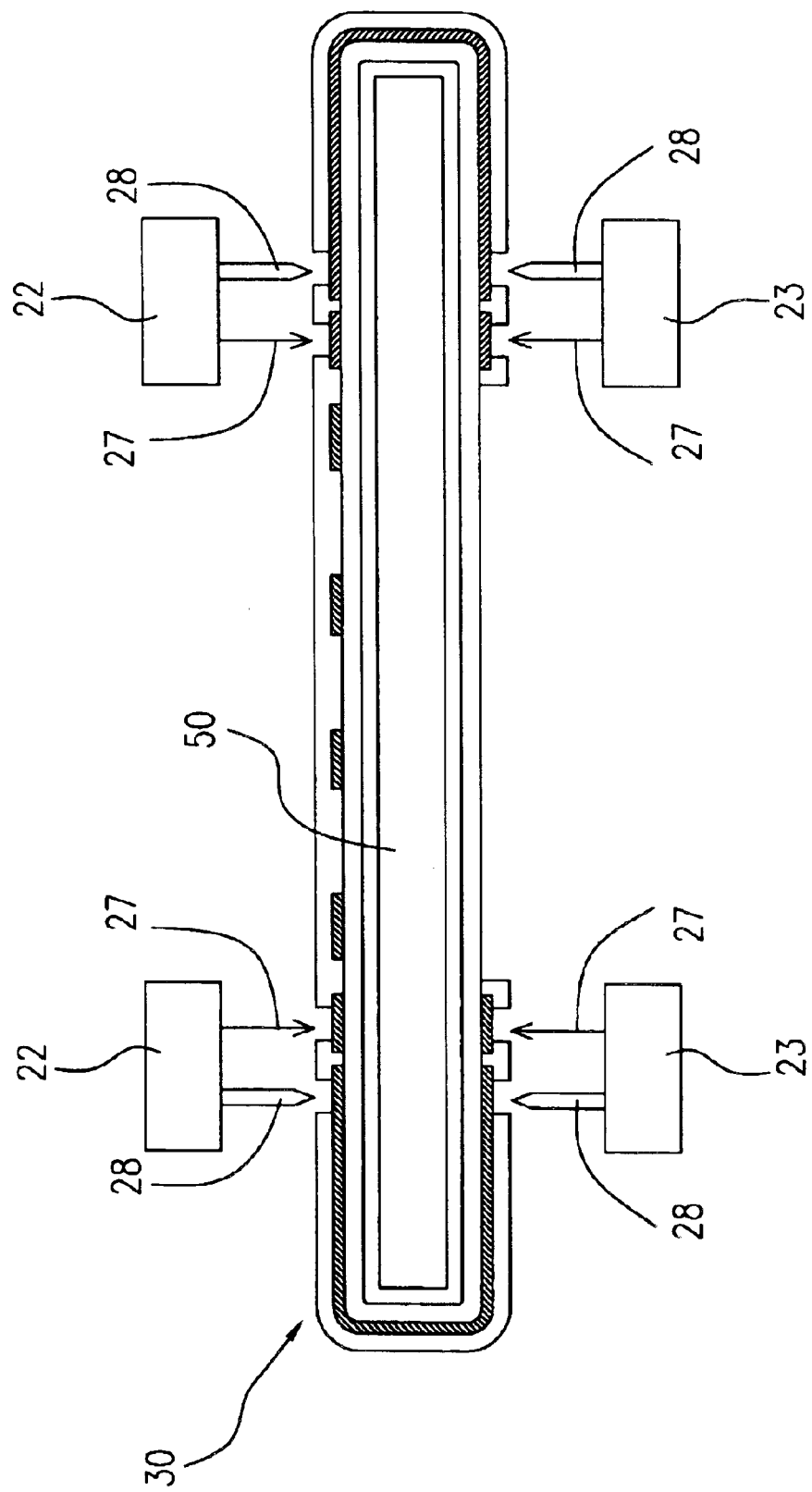
FIG. 2C is a cross-sectional view of an impedance standard substrate with double-sided contacts according to the second embodiment.

As shown in FIG. 2C, there is provided an impedance standard substrate 30 in accordance with the second preferred embodiment of this invention. In this embodiment, the flexible tape 40 is bent and fixed to the fixer 50 so as to have the signal contacts 71 and 72 located at the upper side and the lower side of the impedance standard substrate 30 and faced the probes 22 and 23 respectively.

As mentioned above, the probes 22 and 23 may be different types. For example, the probes may have two grounding connectors disposed at two sides of the signal connector. In such an arrangement, the circuits of the impedance standard substrate 30 shall have three contacts for connecting to the two grounding connectors and the signal connector.

Figure 3A:
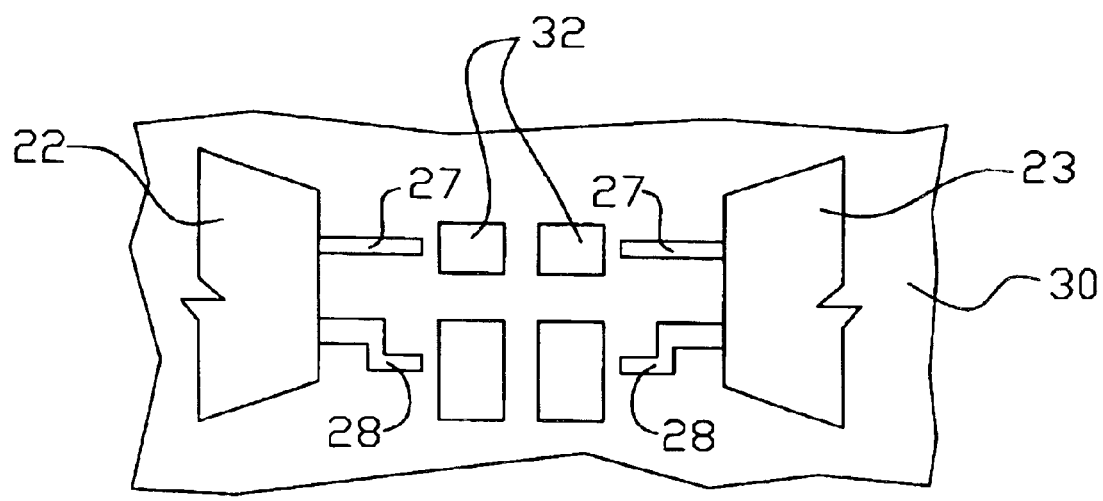
FIGS. 3A to 3D are simplified schematic diagrams of said circuits of the impedance standard substrate.
Figure 3B:
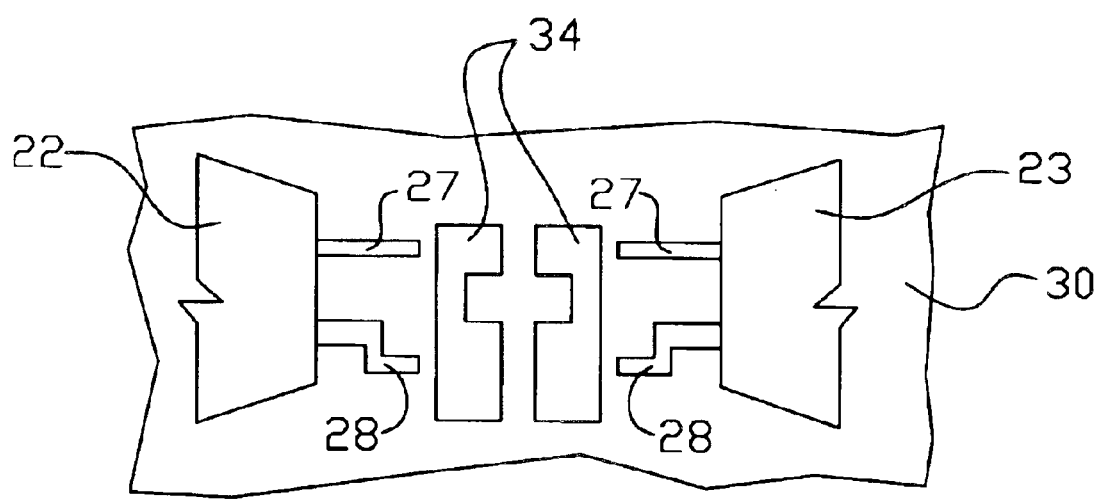
Figure 3C:
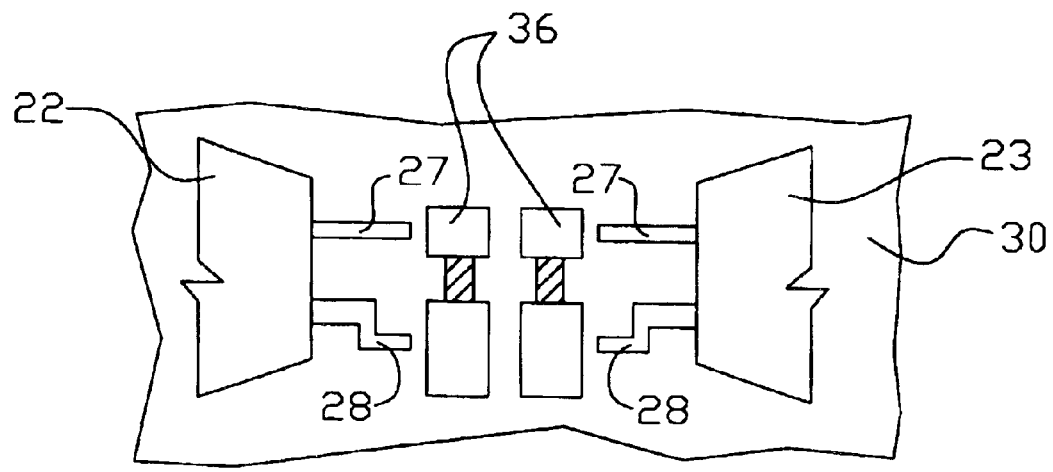
Figure 3D:
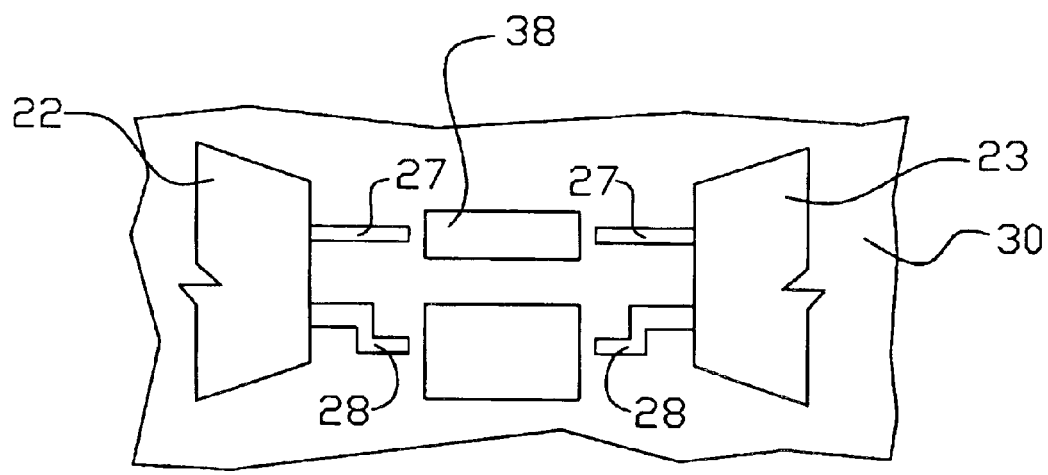

In addition, as shown in FIG. 3A, FIG. 3B, FIG. 3C and FIG. 3D, the flexible tape 40 may have a plurality of pairs of open-circuits 32, short-circuits 34, load-circuits 36 and thru-circuits 38. The probes 22 and 23 of the vector network analyzer 10 are connected to the impedance standard substrate 30 so as to perform adjustment process. As shown from FIG. 3A to FIG. 3C, the open-circuits, the short-circuits, and the load-circuits are geminated. Namely, there are two signal contacts and two grounding contacts for contacting the signal connectors 27 and grounding connectors 28. As shown in FIG. 3D, the two contacts of the thru-circuits 38 are connected to the probes 22 and 23. Said open-circuits, short-circuits and load-circuits are disposed at the flexible tape 40. Namely, said open-circuits, short-circuits and load-circuits are disposed on the upper side and the lower side of the impedance standard substrate 30 or one of the upper side and the lower side. In addition, said open-circuits, short-circuits and load-circuits are disposed at different side of the impedance standard substrate 30.

As mentioned above, the vector network analyzer can utilize the impedance standard substrate to get the double-sided data with an adjustment so as to measure the DUT with the double-sided contacts. Accordingly, the vector network analyzer will not need complex mechanism to have the probes rotated. In addition, we also can get more precisely adjusted data.

Although the invention has been described in considerable detail with reference to certain preferred embodiments, it will be appreciated and understood that various changes and modifications may be made without departing from the spirit and scope of the invention as defined in the appended claims.

What is claimed is:

1. An impedance standard substrate adapting to adjust a vector network analyzer having two probes disposed at an underneath of the impedance standard substrate and an upside of the impedance standard substrate respectively, comprising:
    a fixer; and
    a flexible tape having a thru-circuit with two electrically connecting contacts wherein the flexible tape is bent and fixed to the fixer so as to have the two contacts faced the probes respectively.

2. The impedance standard substrate of claim 1, wherein the flexible tape is bent in the form of "⊏".

3. The impedance standard substrate of claim 1, further comprising an adhesive interposed between the fixer and the flexible tape so as to have the flexible tape fixed to the fixer.

4. The impedance standard substrate of claim 1, further comprising a pair of open-circuits disposed at the flexible tape.

5. The impedance standard substrate of claim 1, further comprising a pair of short-circuits disposed at the flexible tape.

6. The impedance standard substrate of claim 1, further comprising a pair of load-circuits disposed at the flexible tape.

7. A correction method for adjusting a vector network analyzer to provide a measurement signal wherein the vector network analyzer has two probes disposed at an underneath of the impedance standard substrate and an upside of the impedance standard substrate respectively for outputting the measurement signal, comprising:

providing a flexible tape having a thru-circuit with two electrically connecting contacts;

bending the flexible tape and fixing the flexible tape to a fixer so as to have the two contacts faced the probes respectively; and contacting the probes with the two contacts respectively so as to output the measurement signal.

8. The correction method of claim 7, further comprising a step of providing a pair of open-circuits disposed at the flexible tape and contacting the probes with the open-circuits so as to output the measurement signal.

9. The correction method of claim 7, further comprising a step of providing a pair of short-circuits disposed at the flexible tape and contacting the probes with the short-circuits so as to output the measurement signal.

10. The correction method of claim 7, further comprising a step of providing a pair of load-circuits disposed at the flexible tape and contacting the probes with the load-circuits so as to output the measurement signal.

* * * * *